United States Patent [19]

Sillerud et al.

[11] Patent Number: 4,922,203

[45] Date of Patent: May 1, 1990

[54] POLARIZATION TRANSFER NMR IMAGING

[75] Inventors: Laurel O. Sillerud, Los Alamos; David B. van Hulsteyn, Santa Fe, both of N. Mex.

[73] Assignee: The United States of America as represented by the United States Department of Energy, Washington, D.C.

[21] Appl. No.: 305,211

[22] Filed: Jan. 31, 1989

[51] Int. Cl.$^5$ ............................................. G01R 33/20
[52] U.S. Cl. ..................................... 324/307; 324/309
[58] Field of Search .............. 324/300, 307, 309, 310, 324/311, 312, 313, 314, 318

[56] References Cited

U.S. PATENT DOCUMENTS

| | | | |
|---|---|---|---|
| 3,781,650 | 12/1973 | Keller ............................... | 324/0.5 R |
| 4,345,207 | 8/1982 | Bertrand et al. ..................... | 324/314 |
| 4,443,761 | 4/1984 | Levitt .................................. | 324/311 |
| 4,521,732 | 6/1985 | Pegg et al. ........................... | 324/312 |
| 4,682,107 | 7/1987 | Bendall et al. ....................... | 324/307 |
| 4,701,708 | 10/1987 | Hardy et al. ......................... | 324/311 |

OTHER PUBLICATIONS

Laurel O. Sillerud et al., "High-Resolution Proton NMR Studies of Intracellular Metabolites in Yeast Using $^{13}$C Decoupling," 45, J. Magn. Reson., 142–150, (1981).
Ray L. Nunnally et al., "Assessment of Pharmacological Treatment of Myocardial Infarction by Phosphorus-31 NMR with Surface Coils," 211, Science, 177–180, (1981).
Paul A. Bottomley, "NMR Imaging Techniques and Applications: A Review," 53, Rev. Sci. Instrum., No. 9, 1319–1337, (1982).
A. J. Shaka et al., "An Improved Sequence for Broadband Decoupling: WALTZ-16," 52, J. Magn. Reson., 335–338, (1983).
Lynn W. Jelinski, "Modern NMR Spectroscopy," Chem. Eng. News, 26–47, (Nov. 5, 1984).
R. E. Sepponen et al., "A Method for Chemical Shift Imaging: Demonstration of Bone Marrow Involvement with Proton Chemical Shift Imaging," 8, J. Comput. Assist. Tomogr., No. 4, 585–586, (1984).
J. K. T. Lee et al., "Fatty Infiltration of the Liver: Demonstration by Proton Spectroscopic Imaging," 153, Rad., No. 1, 195–201, (1984).
W. T. Dixon, "Simple Proton Spectroscopic Imaging," 153, Rad., No. 1, 189–194, (1984).
P. A. Bottomley et al., "In Vivo Nuclear Magnetic Resonance Chemical Shift Imaging by Selective Irradiation," 81, Proc. Natl. Acad. Sci., 6856–6860, (Nov. 1984).
Laurance D. Hall et al., "Three-Dimensional Fourier Transform NMR Imaging, High Resolution Chemical-Shift Resolved Planar Imaging," 56, J. Magn. Reson., 314–317, (1984).
Yishay Manassen et al., "A Constant Gradient Experi-
(List continued on next page.)

Primary Examiner—Michael J. Tokar
Attorney, Agent, or Firm—Ray G. Wilson; Paul D. Gaetjens; William R. Moser

[57] ABSTRACT

A nuclear magnetic resonance (NMR) image is obtained with spatial information modulated by chemical information. The modulation is obtained through polarization transfer from a first element representing the desired chemical, or functional, information, which is covalently bonded and spin-spin coupled with a second element effective to provide the imaging data. First and second rf pulses are provided at first and second frequencies for exciting the imaging and functional elements, with imaging gradients applied therebetween to spatially separate the nuclei response for imaging. The second rf pulse is applied at a time after the first pulse which is the inverse of the spin coupling constant to select the transfer element nuclei which are spin coupled to the functional element nuclei for imaging. In a particular application, compounds such as glucose, lactate, or lactose, can be labeled with $^{13}$C and metabolic processes involving the compounds can be imaged with the sensitivity of $^1$H and the selectivity of $^{13}$C.

14 Claims, 3 Drawing Sheets

OTHER PUBLICATIONS ment for Chemical-Shift Imaging," 61, J. Magn. Reson., 363-370, (1985).

Joel F. Martin et al., "Chemical-Shift Encoding in NMR Images," 61, J. Magn. Reson., 153-157, (1985).

W. P. Que et al., "Localized $^{13}$C NMR Spectra with Enhanced Sensitivity Obtained by Volume-Selective Excitation," 61, J. Magn. Reson., 392-395, (1985).

H. P. Heatherington et al., "$^1$H Homonuclear Editing of Rat Brain Using Semiselective Pulses," 82, Proc. Natl., Acad. Sci. U.S.A., 3115-3118, (May 1985).

R. J. Ordidge et al., "Image-Selected in Vivo Spectroscopy (ISIS), A New Technique for Spatially Selective NMR Spectroscopy," 66, J. Magn. Reson., 283-294, (1986).

T. Jue, "Winnowing the {$^{13}$C}-$^1$H Resonances in the in Vivo NMR Spectrum," 71, J. Magn. Reson., 532-538, (1987).

Laurel O. Sillerud et al., "{$^{13}$c}-Polarization Transfer Proton NMR Imaging of a Sodium [$^{13}$C] Formate Phantom at 4.7 Tesla," 76, J. Magn. Reson., 380-385, (Feb. 1988).

POLARIZATION TRANSFER NMR IMAGING

BACKGROUND OF THE INVENTION

This invention relates to noninvasive imaging and, more particular. to nuclear magnetic resonance (NMR) imaging. This invention is the result of a contract with the Department of Energy (Contract No. W-7405-ENG-36).

Noninvasive imaging is a powerful modern tool for determining the spatial distribution of various features and characteristics within intact volumes, such as a human body conventional noninvasive imaging techniques include x-rays, using ionizing radiation, ultrasound, using sound reflections from within the volume, and positron emission tomography, using radioactive tracers. A more recent noninvasive imaging method uses nuclear magnetic resonance (NMR), where radio frequency (rf) fields are externally applied to a substance placed in a uniform magnetic field, $B_o$. The rf fields cause the nuclei in the molecules of the body to be misaligned relative to the applied magnetic field The nuclei return to an equilibrium orientation along the uniform applied field within a short time, typically less than one second. In the process, the nuclei emit radio frequency signals known as free induction decay signals (FID) These signals can be Fourier transformed to yield the desired frequency-domain spectrum.

One effect of the external field, $B_o$, is to generate a net magnetization, $M(r)$, in the volume of interest. The externally applied rf makes this magnetization time dependent, $M(r,t)$. The time evolution of this magnetization is represented by the Bloch equation, which relates the time rate of change of a sample magnetization to the strength of the applied gradients, the nuclear precession frequency, and the magnitude of the transverse relaxation time:

$$\frac{dM(r,t)}{M(r,t)} = -\left[2\pi i \gamma\, G \cdot r + 2\pi i\, \nu + \frac{1}{T_2}\right] dt, \quad (1)$$

where  $\nu$ = response frequency in the steady state $B_o$

= $\gamma B_o$ $T_2$ = spin-spin relaxation time for the position vector $r = (x, y, z)$;

$\gamma$ = gyromagnetic ratio of the nucleus of interest;

$M$ = net magnetization $G = G(r)$ = imposed gradient field

Two distinct NMR technologies have developed using the separate terms of Equation (1): NMR spectroscopy and NMR imaging. For spectroscopy, a uniform magnetic field is applied, i.e., $G \cdot r = 0$, and volume-averaged data can be obtained from the measurements of $\nu$ in $B_o$. Thus, by determining the time dependent sample magnetization, the chemical data can be determined from the resulting Fourier transformed frequency-domain output. Only volume-averaged chemical, or functional, data is provided and there is no structural or spatial, resolution of the chemical information.

Conversely, imaging procedures involve the application of gradients to develop spatial resolution through the G·r term. However, the contribution by the $\nu$ term is small relative to G·r in most applications of interest and is neglected. NMR imaging uses magnetic gradients to develop NMR response information, generally a proton response, along selected axes from which structural information can be reconstructed using Fourier analysis. No chemical or functional information is provided because the effect of chemical shift ($\nu$) is dominated by G·r. An overview of NMR imaging techniques is provided in P. A. Bottomley, "NMR Imaging Techniques and Applications: A Review," 53 Rev. Sci. Instr., Vol. 9, 13–37. (1982) incorporated herein by reference, which generally discusses imaging techniques using the direct excitation of protons.

It would be highly desirable to obtain imaged chemical, i.e. functional, data. In one particularly useful application, the capability to image particular carbon compounds would provide the capability to study the metabolic processes in living organisms. The time evolution of the metabolism of compounds such as glucose, lactose, and lactate would provide substantial useful information. Carbon forms the backbone element of those metabolites and would provide the most pertinent imaging data. However, the physical principles of NMR make this very difficult. The nucleus of $^{12}C$, the 99% dominant isotope, has spin zero and, hence, no magnetic moment. Further, the 1% naturally abundant, stable, magnetic isotope, $^{13}C$, with a spin of $\frac{1}{2}$, has only 1/60 the sensitivity of protons, i.e., hydrogen, the most sensitive stable NMR nucleus and the most prevalent nucleus in living organisms. These two factors combine to make impractical the direct imaging of naturally abundant $^{13}C$.

The relative sensitivity of $^{13}$ has been enhanced for NMR spectroscopy by the use of heteronuclear polarization transfer (PT). In this approach, the $^{13}C$ atoms are covalently bound to $^{1}H$ atoms and cause an electronically transferred splitting of the nuclear resonance of the attached $^{1}H$. The effect of the $^{13}C$ nuclei can be decoupled from the proton resonance by applying an rf field resonant with the $^{13}C$ nuclei during acquisition of the proton signals. If the $^{1}H$ spins are then detected with the $^{13}C$ alternately coupled and decoupled, the inferred functional behavior of the $^{13}C$ labeled sites can be observed with the increased sensitivity provided by the $^{1}H$ nuclei. Heteronuclear polarization transfer methods have been used previously in spectroscopic studies, but not in imaging.

Discussions of NMR spectroscopy may be found in L. W. Jelinski, "Modern NMR Spectroscopy," 62 Chem. Eng. News, 26–47 (Nov. 5, 1984), incorporated herein by reference. For a particular application of polarization transfer (PT) in metabolic spectroscopy, see L. O. Sillerud et al., "High-Resolution Proton NMR Studies of Intracellular Metabolics in Yeast Using $^{13}C$ Decoupling," 45 J. Magn. Reson., 142–150 (1981), incorporated herein by reference.

However, obtaining the chemical data provided by PT spectroscopy as a spatially resolved image requires solving, the full Bloch equation (Equation (1)) including both G·r and $\nu$ effects. The application of magnetic gradients to a sample volume, which is required to develop imaging information, has a significant effect on the PT-NMR data developed for spectroscopy. The magnetic field gradients introduce a frequency dispersion through the G·r term which is indistinguishable from the chemical shift contribution. Further, the chemical information is smeared by the magnetic field gradients since the characteristic resonance of each nucleus is also a function of the field intensity at a given location. However, PT imaging requires that both spatial and chemical shift information be retained.

In accordance with the present invention, polarization transfer techniques are combined with fast conventional imaging techniques to provide spatially resolved, i.e., imaged, chemical information. Accordingly, it is an object of the present invention to enable NMR imaging of low sensitivity elements in a background containing a relatively high sensitivity element.

Another object of the present invention is to provide a spatial resolution of the distribution of tracer elements associated with a selected chemical process.

A particular object of the present invention is to provide an image of metabolic processes in living systems.

Yet another object of the present invention is to provide for functional NMR imaging which can be done in a time appropriate for observing the selected chemical processes.

SUMMARY OF THE INVENTION

To achieve the foregoing and other objects, and in accordance with the purposes of the present invention, as embodied and broadly described herein the method of the present invention generates NMR images containing chemical information. A chemical compound is selected with a functional element related to the desired chemical information and a transfer element for generating an NMR imaging signal. The functional element nuclei and the transfer element nuclei are spin-coupled and covalently bound to define two NMR response peaks separated by a coupling constant under NMR excitation at a first frequency related to the transfer element in the compound. A volume containing the compound is excited with a first pulse at the first frequency to initiate the process. Electromagnetic gradients are applied over the volume which are effective to spatially separate a response of the compound to the first excitation frequency. The volume is then excited in the absence of gradients with a second pulse at a second frequency corresponding to the functional element at a time after the first pulse which is the inverse of the coupling constant. Spatial data with the desired chemical information is then acquired from the excited volume in a conventional manner.

In another characterization of the present invention, NMR images are generated containing chemical information using a chemical compound with a functional element related to the chemical information and a transfer element having nuclei covalently bound and spin-spin coupled to nuclei of the functional element. Sequential radio frequency pulses are applied to the compound at first and second frequencies effective for polarization transfer from the functional element to the transfer element. Magnetic field gradients are applied across a volume containing the compound which are effective to spatially separate a nuclear response of the compound to the first pulse, wherein the second pulse is applied in the absence of the gradients. Spatial data are then acquired from the transfer element which is modulated by chemical data from the functional element.

In a particular characterization of the present invention, a method is provided for generating NMR images containing information on the spatial distribution of a selected carbon-$^1$H compound containing both $^{12}$C and $^{13}$C. The compound has $^{13}$C-$^1$H spin-spin coupling which defines a coupling constant J in a volume of interest. The volume containing the compound is excited with the first rf pulse having a first frequency effective to excite $^1$H nuclei in the compound. At least one magnetic field gradient is then applied to the volume to spatially separate the response of the $^1$H nuclei to the first pulse. The volume is excited with a second rf pulse having a second frequency and a phase effective to distinguish the response of $^{13}$C-coupled $^1$H from $^{12}$C-coupled $^1$H and applied at a time after the first pulse which is the inverse of the coupling constant J. Spatial data is then acquired which includes the location of carbon in the volume of interest to provide information on the metabolic processes.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

In accordance with the present invention, functional, i.e., chemical information is obtained from polarization transfer and is then spatially resolved to form an image of the functional activity. The coupling constant for resonance splitting induced by the spin-spin coupling of a selected functional element covalently bound to a transfer element in a compound is used to define a magnetic field application scheme which enables the functional element to be imaged within the volume to which the magnetic fields are applied. The coupling constant defines a timing for application of a polarization transfer pulse which causes the nuclear magnetization to refocus at a time determined by the coupling constant for image data acquisition without background contributions. In some instances, the primary functional element has no spin and is not effective for resonance splitting. If so, a tracer functional element with a suitable spin may be found and substituted for at least a portion of the primary functional element.

The present invention uses the fact that the two coupled, split resonances of the transfer element nucleus in a functional-transfer element compound are displaced $\pm J/2$ Hz from the signal of the uncoupled transfer element, where J is the coupling constant. It is generally true for samples of interest that the transverse relaxation time, $T_2$, of the sample is long relative to the imaging time so that its contribution can be neglected. Thus in a one dimensional example, Equation (1) can be integrated to give, $$M(t) = \int^{A/2} \int_{-A/2} M_o(x,\nu)\, e^{-2\pi i[\gamma G_x x + \nu]t}\, d\nu\, dx, \qquad (2)$$

where
A = spatial extent of sample in x-direction; and
$d\nu$ denotes integration over the sample resonances.

Equation (2) relates the magnetization $M_o$ at each point x, and each chemical frequency shift, $\nu$, of a given volume element to the observed NMR signal M(t). The dependence of the signal on y and z is suppressed for simplicity, but is accounted for by the use of a conventional spin warp/slice selection technique as taught by W. Edelstein et al., 25 Phys. Med. Biol., 751 (1980), incorporated herein by reference. Thus, the objective of PT imaging in accordance with the present invention is to extract $M_o(x,\nu)$ from Equation (2) and then display the image as a function of x (i.e., spatial resolution) for each frequency $\nu$ (i.e., chemical resolution).

For polarization transfer imaging, let the frequency of the decoupled transfer nuclei signals, i.e., the NMR response with no spin coupling, be the reference at $\nu=0$ Hz. The spin-coupled signals are equally spaced by J Hz. In general, a number of shifted response peaks from the spin-spin coupling may arise. However, the two coupled response peaks adjacent the uncoupled response peak are located at $\nu = \pm J/2$ Hz i.e. the spin $\frac{1}{2}$ case, and will be the only peaks considered in the following exemplary analysis. The magnetization of the transfer nuclei that are coupled to the functional or tracer nuclei, is denoted by $M_{01}(x)$. If a tracer is required, the magnetization of the transfer element nuclei that are not coupled to the primary functional nuclei is designated by $M_{02}(x)$. With an element decoupling signal applied, $M_{01}$ $M_{02}$ and occur at $\nu=0$, and Equation (2) becomes $$M^{on}(t) = \int_{-A/2}^{A/2} [2M_{01}(x) + M_{02}(x)] e^{-i\alpha x t} dx + \int_{-A/2}^{A/2} \int M_o(\nu,x) e^{-2\pi i \nu t} d\nu dx, \quad (3)$$

where $\alpha = 2\pi\gamma G_x$.

The second integral represents all background contributions due to unwanted resonances.

With the decoupling signal OFF, $M_{02}$ occurs at $\nu=0$ and the two components of $M_{01}$ are shifted to $\nu = \pm J/2$:

$$M^{off}(t) = \int_{-A/2}^{A/2} M_{02}(x) e^{-i\alpha x t} dx + \int_{-A/2}^{A/2} M_{01}(x) e^{i\pi Jt} e^{-i\alpha x t} dx + \int_{-A/2}^{A/2} M_{01}(x) e^{-i\pi Jt} e^{-i\alpha x t} dx + \int_{-A/2}^{A/2} \int M_o(\nu,x) e^{-2\pi i\nu t} e^{-i\alpha x t} d\nu dx \quad (4)$$

For imaging, the magnetization $M_{01}(x)$ of the labeled molecular sites must be extracted. If the transfer element excitation pulse is applied at t=0 with an applied decoupling pulse the nuclear magnetization will refocus at t=1/J. The application at t=1/J of successive 0° and 180° phase pulses for tracer element excitation will act to select the tracer functional element from the primary functional element response. Evaluating Equations (3) and (4) at t=1/J and then subtracting yields the result:

$$M^{on}(t) - M^{off}(t) = 4 \int_{-A/2}^{A/2} M_{01}(x) e^{-i\alpha x t} dx. \quad (5)$$

From this magnetization signal, the image signal $M_{01}(x)$ is directly computed by Fourier transformation.

It has been recognized for NMR spectroscopy that the coupling constant J can be used to determine a timing sequence in a uniform magnetic field to distinguish a tracer element ($^{13}$C) from a primary element ($^{12}$C), T. Jue, "Winnowing {$^{13}$C}-$^1$H Resonances in the in Vivo NMR Spectrum," 71 J. Magn. Reson., 339 (1985), incorporated herein by reference. However, it has not been previously recognized that a timing sequence based on the coupling constant J will enable the functional (chemical) nuclei to modulate the spatial data to provide a functional image of the interior of a volume.

In accordance with the present invention, it is further recognized that a timing sequence based on the coupling constant J will enable imaging data to be extracted even in the presence of the gradient fields required for imaging. The effect of the gradient fields on Equations (1)–(4) is to cause a spread in resonance frequencies as a function of the local field, with a concomitant overlap of many frequencies of interest. However, the coupling constant J remains constant, irrespective of the local field intensities, so that the above timing sequence enables the $M_{01}(x)$ signal to be extracted to form an image with both spatial (structural) and functional (chemical) information.

The application of PT-NMR spectroscopy techniques for enhancing chemical NMR signals for NMR imaging, as herein described, requires the recognition of additional techniques to provide for signal selection while providing spatial information. These techniques include:

1. The elimination of imaging gradients during signal acquisition except for the gradient which serves to refocus the magnetization.

2. The application of the rf pulses for tracer or functional nuclear excitation only when the gradients are off to obtain the nuclear phasing needed to distinguish the tracer element from adjacent resonances.

3. The selection of an excitation sequence effective to excite the element of interest and suppress other excitations.

4. The selection of a sequence to provide signals within the dynamic range of the detection equipment.

As discussed above, a particularly useful application of PT-NMR imaging is to image metabolic activity in living systems. However, living systems are predominantly water, which provides structural images and has a very large $^1$H response. Other elements essential to metabolism, such as carbon, which has relatively low $^{13}$C abundance and low sensitivity, are difficult to image directly. Thus, protons which are bound to $^{13}$C must be distinguished from the protons which are in water, bound to $^{12}$C, or bound to other elements. The use of $^{13}$C as a tracer element can be enhanced by introducing materials which are enriched with $^{13}$C and which are involved in a metabolic process. Water signals can be first suppressed and then eliminated in accordance with the present invention.

To demonstrate the capabilities of the present technique, a $^{13}C$ signal was imaged and differentiated from an adjacent water sample by using heteronuclear spin coupling of $^{13}C$ to protons to edit the proton image and select only those protons covalently bound to $^{13}C$. The sample used in the following example contained $10^{-2}$ mol of $^{13}C$, approximately the amount that would be present in the 1.4 kg brain of an adult human male weighing 70 kg.

Figure 1:
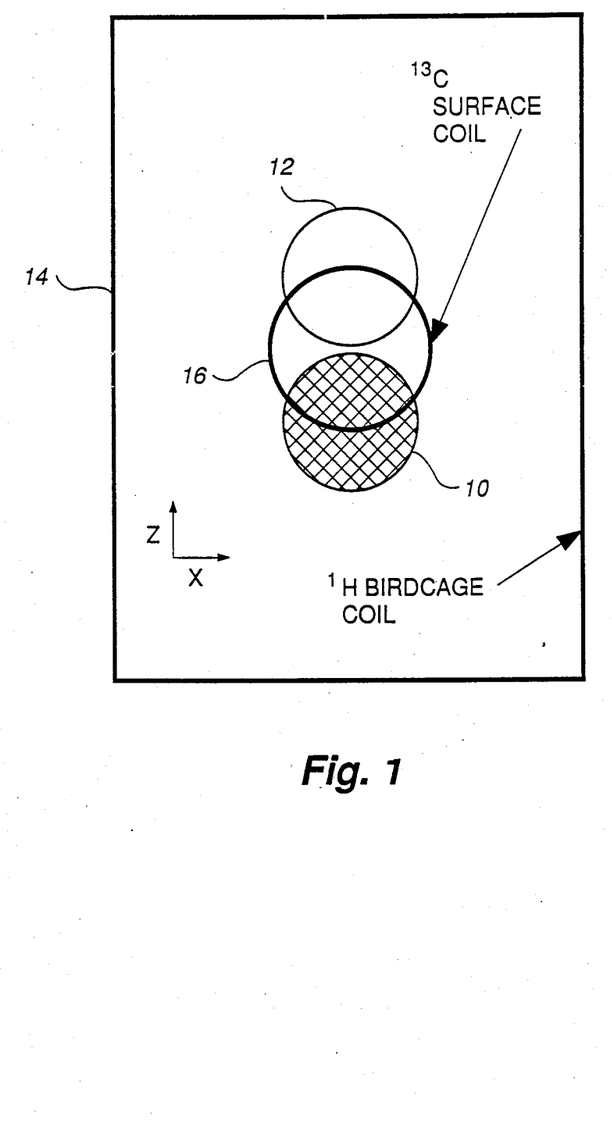
FIG. 1 is a pictorial representation of sample materials oriented in NMR excitation coils to demonstrate the efficacy of the present invention.

FIG. 1 schematically depicts the orientation of the samples within the NMR coils. The samples consisted of two polyethylene scintillation vials 25 mm in diameter, one vial 10 containing ten ml of a 1.0M solution of sodium [$^{13}C$ (99 +%)]formate in water and vial 12 containing 7.8 ml of distilled, deionized water. The spectra and images were obtained with a GE 4.7 T CSI NMR system. Protons were detected using a 17.0 cm diameter GE birdcage coil 14 tuned to 200 MHz, while $^{13}C$ rf at 50.3 MHz was applied to the samples through the 3.0 cm, balanced, two-turn surface coil 16. The samples were placed on top of surface coil 16 and the assembly was inserted orthogonal to bird cage proton coil 14. In this example, the total sample diameter was larger then the diameter of the $^{13}C$ coil. It is normally preferred to have the surface coil 16 diameter larger than the sample diameter for full sample magnetization.

Figure 2:
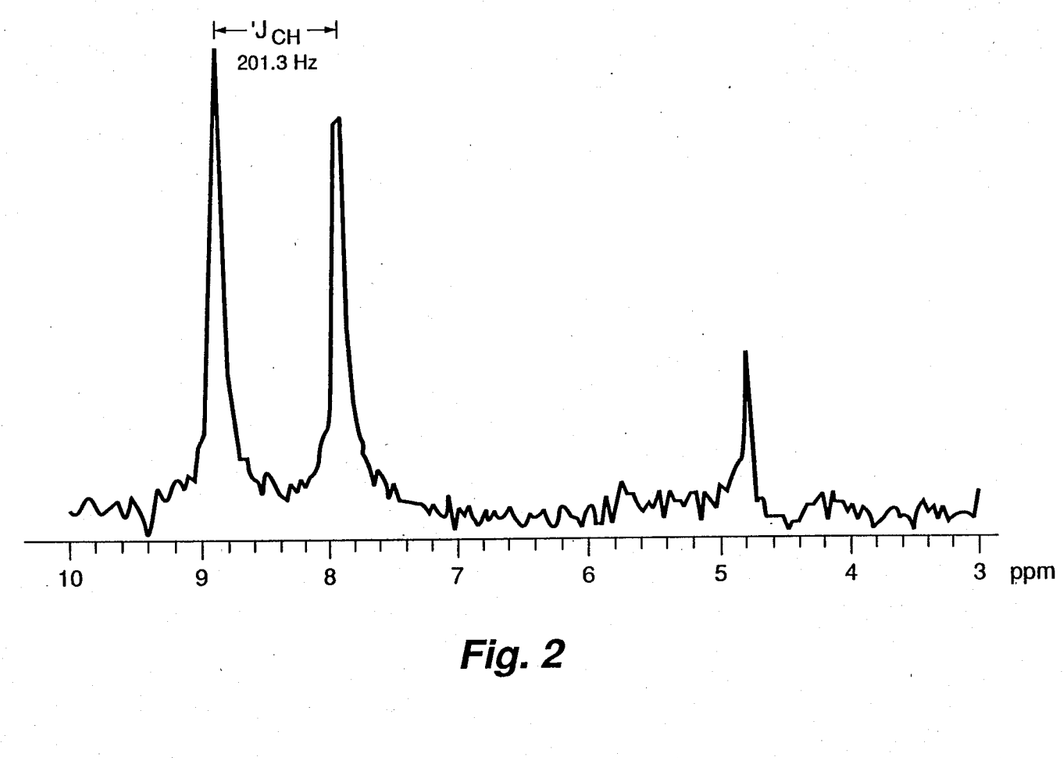
FIG. 2 graphically depicts the spectroscopic response of a compound containing $^{13}$C and placed in one of the vials shown in FIG. 1.

FIG. 2 graphically depicts the proton NMR spectrum at 200 MHz of the sodium [$^{13}$] formate sample of vial 10. The large carbon-induced spin-spin splitting ($^1J_{CH}=201.3$ Hz) of the formate nonexchangeable proton resonance is centered at 8.4 ppm. The spectrum was obtained using a 1331 water suppression sequence, as taught by P. J. Hore 55 J. Magn. Res., 283 (1983), coupled with receiver phase cycling and acquisition of the $^{13}C$ echo difference. The partially suppressed solvent water signal is shown at 4.8 ppm; the suppression factor was about 600.

Figure 3:
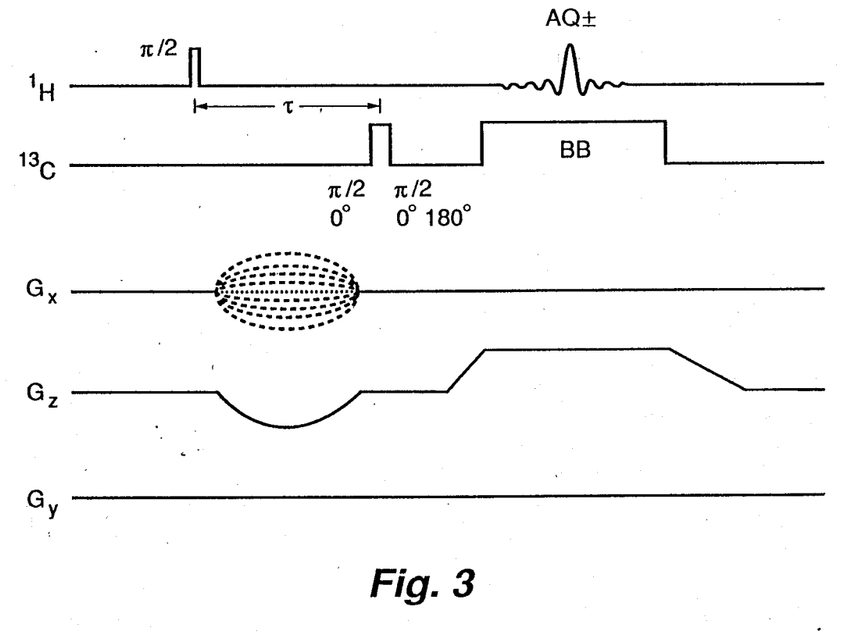
FIG. 3 is a timing diagram of the polarization transfer pulse applications and the imaging gradients application through the coils shown in FIG. 1.

An image of vials 10 and 12 was formed using the sequence of magnetizing fields shown in FIG. 3. The application of gradients $G_x$, $G_z$, and $G_y$, provides a basic gradient-recalled echo imaging sequence which is merged with a PT activation sequence for the $^1H$ and carbon elements. The magnitudes of gradients $G_x$, $G_y$, and $G_z$ are routinely, selected based on the sample volume and the specific imaging routine to be used. A WALTZ-16 $^{13}C$ decoupling sequence, as taught A. J. Shaka, 52 J. Magn. Reson., 335(1983), was used with a 90° pulse of 250 μs and a decoupler power of 105 W, with a bandwidth of 2 kHz. The echo time was 5 ms, the time after application of the $^{13}C$ pulses, equal to the time interval between the $^1H$ and the $^{13}C$ pulses and the inverse of the coupling constant, with an acquisition time of 2.4 ms. A single signal scan was accumulated for the standard proton image and 100 scans were accumulated for the Polarization transfer image 50 with a receiver phase of 0° and 50, with a 180° phase shift. An image of 128 by 128 pixels was formed with a total experiment time of 16 min. In this embodiment the time-domain data was multiplied by a trapezoid that linearly increased from 0 to 1 in the first 33 data points remained constant at 1 for the next 64 points, and dropped from 1 to 0 in the last 32 points, for a data set of 128 acquired points. The standard proton image was also obtained using a gradient-refocused echo sequence with a slice thickness of 20 mm, using a 2 ms sync pulse and an echo time (5 ms) the same as that for the polarization transfer image.

It will be appreciated from FIG. 1 that $^1H$ and $^{13}C$ excitation pulses are separated by time $\tau$, which is the inverse of the coupling constant of 201.3 Hz, shown in FIG. 2. Gradient fields $G_x$ and $G_z$ are applied between the application of the decoupled proton pulse and the $^{13}C$ pulses. The proton pulse is applied during a uniform magnetic field in order to effect the entire volume. Thereafter gradient fields $G_x$ and $G_z$ are applied to spatially separate the proton response within the volume. The gradient fields are again returned to a uniform field and the $^{13}C$ pulses are alternately applied with a 0° phase and 180° phase in order to select the response of those molecules containing $^{13}C$ from molecules containing $^{12}C$ and from the response of any other compound which may be present with a coupling constant close to the sample coupling constant. The phased $^{13}C$ pulses at time $\tau$ provide the phase relationship shown by Equations (3), (4) and (5) whereby the acquisition of the signals at echo time $\tau$ provides only the proton response which is coupled to $^{13}C$. A standard broadband $^{13}C$ decoupling pulse is applied during signal acquisition.

The applied proton pulse is a water suppression pulse, i.e., an excitation pulse having 1331 sequence, as herein above discussed. The water suppression sequence along with the exclusion of protons not bound to the functional atom provides virtually a total exclusion of background water response while limiting the required system dynamics to the expected signal of interest. In the absence of an initial water suppression, the signal dynamics would have to provide for the enormous response of protons in the background water molecules.

The experimental arrangement shown in FIG. 1 was used to obtain three images designed to demonstrate chemical imaging using the imaging sequence according to the present invention: (1) a standard proton imaging sequence: (2) the polarization transfer sequence shown in FIG. 3 with the $^{13}C$ pulses applied; and (3) the polarization transfer sequence shown in FIG. 3 done with the $^{13}C$ pulses off. Broadband $^{13}C$ decoupling was used during acquisition for both the polarization transfer images. All of the images obtained were projections of the sample spin density onto the x, z imaging plane. The standard proton image sequence provided an image from the water and the water and formate in the two vials. The polarization transfer {$^{13}C$}-$^1H$ image of the same pair of samples with the $^{13}C$ pulses applied shows only a signal from the [$^{13}C$] formate sample, with no image of the vial containing only water. When the $^{13}C$ pulses were not applied during the polarization transfer sequence, neither vial appeared in the resulting image. The polarization transfer imaging sequence (FIG. 3) resulted in the selection of only signals from the protons that were spin-coupled to the $^{13}C$, showing excellent rejection of the water-only signal to demonstrate the efficacy of the polarization transfer imaging sequence.

From the difference in the number of scans (1/100), the concentrations of image protons (1/110), and the relative signal-to-noise ratios (12/139) of the images, it is estimated that the $^{13}C$ is being imaged with virtually the sensitivity of the protons. With the $^{13}C$ pulses turned off and the polarization transfer sequence repeated, no image was obtained from either vial, indicating that there is good cancellation of proton signals from the background of coupled proton spins.

These results demonstrate that the NMR images of selected functional elements can be obtained using the polarization transfer technique to substantially enhance the sensitivity of detecting the functional elements. The particular example demonstrates the capability of the approach for observing spatially resolved metabolic processes.

The images obtained using the above experimental process can be substantially enhanced. One sensitivity enhancement would provide continuous $^{13}C$ decoupling to obtain an Overhauser enhancement of about 23%. Further, the specific gradient applications hereinabove discussed are not an inherent limitation of the polarization transfer imaging approach. The only requirement is that the magnetic field be uniform during application of the functional nucleus, e.g., $^{13}C$, excitation pulses so that signal phasing is effective for chemically modulated imaging data to be extracted. In addition, in a metabolic process imaging application, the exact chemical species to be used for imaging would be determined by that process.

The sequence herein described is generally applicable to homo- or heteronuclear compounds which exhibit resonance splitting with a coupling constant between the two resonance peaks. The metabolic imaging case is a stringent imaging situation where the background materials include large amounts of the transfer element, i.e., $^1H$, and a tracer element, i.e., $^{13}C$, is required since the primary element, i.e., $^{12}C$ has no spin. The technique, as illustrated in Equations (2)–(5), does not require this stringent environment.

While only one example of PT-NMR imaging is set forth above, it will be appreciated that the principles illustrated by the reference are applicable to numerous variations:

1. Homo-nuclear imaging may be used with certain compounds, e.g., glucose and lactate. In these compounds, the $^1H$ bonds at different locations give rise to resonance splitting with concomitant coupling constants to enable the chemically modulated imaging to be obtained.

2. Hetero-nuclear compounds with protons $^{13}C$ is not the only functional element useful in PT-NMR imaging. For example, selective irradiation of a boron hydride can provide images of boron isotopes at specific body locations for cancer treatment. PT-NMR imaging using $^{11}B$-$^1H$ spin coupling could provide specific location information for focusing a neutron source on the boron compound. If functional imaging of nitrogen is desired, a $^{15}N$-$^1H$ spin coupling can be used with a suitable compound, e.g., ammonia. In one further example, water could be expressly imaged, where $^{17}O$-$^1H$ spin coupling is used.

3. Hetero-nuclear compounds with x nuclei. In some instances, PT-NMR imaging can be used without protons, where elements are spin-spin coupled and one element has a gyromagnetic ratio, $\gamma$, greater than the spin coupled element. For example, arginine, an amino acid, or urea could be PT-NMR imaged using $^{13}C-^{15}N$ spin coupling. $^{13}C$ would be an appropriate transfer element for use with $^{19}F$ in, e.g., trifluoroacetic acid. In these instances, PT speeds up the imaging process through the higher sensitivity nuclei and renders "imageable" nuclear species which cannot practically be imaged using direct imaging methods.

4. Slice-selection PT-NMR imaging can be obtained by applying the transfer nucleus excitation pulse in the presence of a gradient. Only a small volume normal to the gradient, i.e., a slice will be in resonance to be excited by the rf frequency in the pulse.

5. Reverse PT-NMR imaging. While it is usually most advantageous to provide polarization transfer from the low $\gamma$ nuclei to the high $\gamma$ nuclei and thereby image the low $\gamma$ nuclei with the enhanced sensitivity of the high $\gamma$ species, it may be advantageous to reverse the polarization transfer, i.e., from the high $\gamma$ nuclei to the low nuclei. According to the present invention reverse imaging is obtained by first exciting the low $\gamma$ nuclei and then exciting the high $\gamma$ nuclei after the imaging gradients are removed.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for generating NMR images containing chemical information, comprising the steps of:

selecting a chemical compound with a functional element related to said chemical information and a transfer element for generating an NMR imaging signal, with nuclei of said functional element and said transfer element spin-coupled and covalently bound to define two NMR response peaks separated by a coupling constant under NMR excitation at a first frequency related to said transfer element in said compound;

exciting a volume containing said compound with first pulses at said first frequency;

applying electromagnetic gradients to said volume effective to spatially separate a response of said compound to said first frequency;

exciting said volume with a second pulse at a second frequency corresponding to said functional element at a time after said first pulse which is the inverse of said coupling constant;

said second pulse being applied only in the absence of said gradients; and acquiring spatial data from said transfer element having chemical data modulated by said functional element.

2. A method according to claim 1, wherein said transfer element and said functional element are nuclei of the same element at different molecular locations.

3. A method according to claim 2, wherein said compound is heteronuclear and the functional element is spin coupled with said transfer element.

4. A method according to claim 3, wherein said functional element is a tracer element which spin couples with said transfer element.

5. A method according to claim 3 or 4, wherein said transfer element has a gyromagnetic ratio greater than said functional element.

6. A method according to claim 1, further including the step of providing a water suppression sequence in said first pulse.

7. A method according to claim 1 or 6, wherein said second pulse includes alternate phase pulses of 0° and 180°.

8. A method for generating NMR images containing chemical information, comprising the steps of:

selecting a chemical compound with a functional element related to said chemical information and a transfer element having nuclei covalently bound and spin-spin coupled to nuclei of said functional element;

applying sequential radio frequency pulses to said compound at first and second frequencies effective for polarization transfer from said functional element to said transfer element;

applying magnetic field gradients across a volume containing said compound effective to spatially separate a nuclear response of said compound to said first pulse, wherein said second pulse is applied in the absence of said gradients; and acquiring spatial data from said transfer element which is modulated by chemical data from said functional element.

9. A method according to claim 8, wherein said second pulse is spaced from said first pulse by a time functionally determined by a coupling constant of the NMR response of said spin-spin coupled nuclei.

10. A method according to claims 8 or 9, wherein said transfer element has a gyromagnetic ratio greater than said functional element.

11. A method according to claim 10, wherein said second Pulse includes alternate phase pulses of 0° and 180°.

12. A method for generating NMR images containing information on the spatial distribution of a selected carbon-hydrogen compound with both $^{12}C$ and $^{13}C$ and having $^{13}C-^{1}H$ spin-spin coupling defining a coupling constant J in a volume of interest, comprising the steps of:

exciting said volume containing said compound with a first rf pulse having a first frequency effective to excite hydrogen atoms in said compound;

applying at least one magnetic field gradient across said volume to spatially separate a response of said hydrogen atoms to said first pulse;

exciting said volume with a second rf pulse having a second frequency and a phase effective to distinguish the $^{13}C$-coupled $^{1}H$ response and applied at a time after said first pulse which is the inverse of said coupling constant; and acquiring spatial data from said $^{1}H$ response which is modulated by said $^{13}C$ in said volume of interest.

13. A method according to claim 12, further including the step of providing a water suppression sequence in said first pulse.

14. A method according to claim 12 or 13, wherein said second pulse includes alternate phase pulses of 0° and 180°.

* * * * *

UNITED STATES PATENT AND TRADEMARK OFFICE
CERTIFICATE OF CORRECTION

PATENT NO. : 4,922,203
DATED : May 1, 1990
INVENTOR(S) : Laurel O. Sillerud et al.

It is certified that error appears in the above-identified patent and that said Letters Patent is hereby corrected as shown below:

ON TITLE PAGE: Item [75] "inventors" add
-- Richard H. Griffey, Sandia Park --.

Signed and Sealed this

Fifth Day of November, 1991

*Attest:*

HARRY F. MANBECK, JR.

*Attesting Officer*      *Commissioner of Patents and Trademarks*